United States Patent
Colbourne

(10) Patent No.: US 7,668,216 B2
(45) Date of Patent: Feb. 23, 2010

(54) COHERENCE REDUCTION OF DIODE LASERS

(75) Inventor: Paul Colbourne, Ottawa (CA)

(73) Assignee: JDS Uniphase Corporation, Milpitas, CA (US)

(*) Notice: Subject to any disclaimer, the term of this patent is extended or adjusted under 35 U.S.C. 154(b) by 63 days.

(21) Appl. No.: 12/155,580

(22) Filed: Jun. 6, 2008

(65) Prior Publication Data
US 2008/0247429 A1 Oct. 9, 2008

Related U.S. Application Data

(63) Continuation-in-part of application No. 11/171,242, filed on Jul. 1, 2005, now abandoned.

(60) Provisional application No. 60/585,083, filed on Jul. 6, 2004.

(51) Int. Cl.
*H01S 3/00* (2006.01)

(52) U.S. Cl. .................. 372/38.07; 372/29.015

(58) Field of Classification Search .......... 372/38.02, 372/29.012, 38.07, 29.015; 385/126
See application file for complete search history.

(56) References Cited

U.S. PATENT DOCUMENTS

| 4,464,759 A | 8/1984 | Haus et al. ............. 372/18 |
| 4,737,798 A | 4/1988 | Lonis et al. ............ 347/247 |
| 5,136,600 A | 8/1992 | Fidric et al. ............. 372/32 |
| 5,170,403 A | 12/1992 | Mayer .................... 372/26 |
| 5,267,019 A | 11/1993 | Whittaker et al. ........ 356/437 |
| 5,448,548 A | 9/1995 | Taneya et al. ........... 369/121 |
| 6,282,218 B1* | 8/2001 | Anderson ............ 372/38.02 |
| 6,647,040 B2* | 11/2003 | Dietrich et al. ....... 372/38.01 |
| 6,754,158 B1 | 6/2004 | Kobayashi et al. ..... 369/59.11 |
| 6,822,987 B2* | 11/2004 | Diaz et al. ........... 372/38.02 |
| 6,907,055 B2* | 6/2005 | Morley et al. .......... 372/38.1 |
| 7,023,886 B2 | 4/2006 | Deacon .................. 372/20 |
| 2004/0076373 A1 | 4/2004 | Blow et al. .............. 385/27 |

FOREIGN PATENT DOCUMENTS

CA 2222002 11/1997

* cited by examiner

*Primary Examiner*—Minsun Harvey
*Assistant Examiner*—Tuan N. Nguyen
(74) *Attorney, Agent, or Firm*—Teitelbaum & MacLean; Neil Teitelbaum; Doug MacLean

(57) ABSTRACT

The invention provides a method of reducing a time-averaged coherence of laser radiation for current-tunable lasers, and a laser apparatus realizing the method, by modulating the laser drive current using a modulation function optimized for obtaining a pre-determined time-averaged spectral profile of the laser radiation. In a preferred embodiment, the pre-determined time-averaged spectral profile has a substantially Gaussian shape. The method is described in reference to laser diodes.

18 Claims, 9 Drawing Sheets

COHERENCE REDUCTION OF DIODE LASERS

CROSS-REFERENCE TO RELATED APPLICATIONS

The present application is a continuation-in-part of U.S. patent application Ser. No. 11/171,242, filed Jul. 1, 2005, now abandoned by Paul Colbourne, entitled "Coherence Reduction of Diode Lasers", which claims priority from U.S. Provisional Patent Application No. 60/585,083 filed Jul. 6, 2004, by Paul Colbourne, entitled "Coherence Reduction Of Diode Lasers", the disclosures of which are incorporated herein by reference for all purposes.

TECHNICAL FIELD

The present invention relates to methods for reduction of coherence of laser radiation, and to laser devices for emitting laser radiation with reduced coherence for use in laser metrology.

BACKGROUND OF THE INVENTION

Lasers are commonly used for optical probing of materials and devices because of their ability to provide almost monochromatic optical radiation at a well-defined wavelength with low beam divergence and sufficient intensity. Laser diodes have proven to be very useful in such applications as laser spectroscopy and in testing of optical characteristics of fiber-optic and other optical components. However, a typically very narrow optical spectrum of lasers is associated with a high degree of coherence of the laser radiation, which can lead to undesirable noise-like interference effects during optical test measurements.

Therefore, in some applications of diode lasers it is desirable to effectively reduce the coherence of the laser, to minimize the interference effects. An example is a fiber optic loss meter, where power-calibrated laser diode radiation is transmitted through a fiber-optic component, and the transmitted radiation is detected by a power meter to obtain a power reading. During the measurement, interference effects between fiber connectors can cause variations in the power readings. A known solution to this problem is to effectively reduce the laser coherence by modulating the laser wavelength with a triangle or sinusoidal wave pattern to cause averaging of the interference effect by a light-detecting device used in the measurement. For diode lasers, wavelength modulation can be accomplished by modulating the laser drive current, for example with a triangle wave pattern.

It is known in the art that a diode laser's wavelength varies with the drive current for several reasons, including changing refractive index of the laser diode chip due to changing chip temperature, and changing the refractive index due to injected free carriers. Modulating the laser current therefore has the effect of varying the laser wavelength over time, effectively broadening the laser spectrum and hence reducing the laser coherence, so that a power reading averaged over a time greater than the modulation period will have reduced interference effects.

This method is effective for fiber optic components with fiber pigtails, where the optical path differences (OPD) causing the interference effects are typically greater than 1 meter due to the length of the fiber pigtails. However, in some applications interference effects from surfaces only a few centimeters apart must be minimized. In these applications, simple modulation functions such as a triangle wave or a square wave may not provide satisfactory results.

It is therefore an object of the present invention to provide a method of modulating a drive current of a laser diode using a modulation function optimized for reducing coherence of laser diode radiation.

SUMMARY OF THE INVENTION

In accordance with the invention, a method of modulation of a drive current of a laser diode is provided for obtaining laser radiation having a target time-averaged spectral profile, the laser radiation having a frequency or a wavelength dependent on said drive current, the method comprising the steps of: (a) determining a modulation function for the drive current, and (b) modulating the drive current of the laser diode using said modulation function; wherein step (a) comprises determining a shape of the modulation function from the target time-averaged spectral profile using the dependence of the frequency parameter on the drive current.

In accordance with one feature of this invention, the target spectral profile is substantially Gaussian for optimally reducing a coherence of the laser radiation.

In accordance with another aspect of the present invention, a method is provided for coherence reduction of time-averaged radiation of a laser diode having a central wavelength and a power dependent on a drive current. The method comprises the step of determining a modulation function of the drive current for obtaining a pre-determined spectral profile of the time-averaged radiation, the pre-determined spectral profile being substantially Gaussian, and the step of modulating the drive current of the laser diode using said modulation function, wherein the step of determining a modulation function comprises performing the steps of i) selecting a set of drive current values, ii) determining an inverse modulation function by first determining, for each drive current value from the set of the drive current values, a fraction of time parameter using the pre-determined spectral profile and values of the central wavelength and the power corresponding to said drive current value, and then determining a time value corresponding to the drive current value using said fraction of time parameter, and iii) determining the modulation function from the inverse modulation function.

Another feature of the present invention provides a laser apparatus for emitting optical radiation with a time-averaged spectral profile having a target spectral shape. The laser apparatus comprises a laser having a wavelength dependent on a drive current, a current source for supplying the drive current to the laser, and modulating means for modulating the drive current using a pre-determined modulation function, wherein the modulation function is determined from the target spectral shape using a pre-determined dependence of the laser wavelength on the drive current.

Another aspect of the present invention provides a method of coherence reduction for a laser diode having a laser wavelength $\lambda$ which varies in dependence upon a drive current J of the laser diode, the method comprising: periodically modulating the drive current J of the laser diode within a current modulation interval $(J_{min}, J_{max})$ between a minimum drive current $J_{min}$ and a maximum drive current $J_{max}$ using a modulation function $J(t)$, wherein t represents time, wherein said modulation function $J(t)$ is characterized by a greater slope at the edges of the current modulation interval $(J_{min}, J_{max})$ than in the middle thereof, so as to provide laser radiation with an optical spectrum having a Gaussian-like shape when averaged over at least one modulation time span that is defined as a time interval wherein the modulation function J(t) varies between $J_{min}$ and $J_{max}$.

A laser apparatus is further provided implementing the method of claim 1, comprising the laser diode having the wavelength λ that depends on the drive current J, a current source for supplying the drive current to the laser, a first memory for storing the modulation function J(t), and a modulator coupled to the current source and the memory for periodically modulating the drive current J of the laser diode using the modulation function stored in the memory.

BRIEF DESCRIPTION OF THE DRAWINGS

The invention will be described in greater detail with reference to the accompanying drawings which represent preferred embodiments thereof, wherein.

DETAILED DESCRIPTION

This invention provides a method of modulation of a wavelength λ of a laser diode, and a laser apparatus realizing it, for obtaining a target time-averaged spectral profile of the laser radiation. The target spectral profile can be pre-determined, or it can be a spectral profile that is suited for a particular application, and can be selected during the laser diode operation based on the application. In a preferred embodiment of the invention, the target time-averaged spectral profile is a spectral profile optimized for reducing coherence of laser radiation at small to medium optical path differences (OPD). Quantitative definition of the term "small to medium OPDs" depends on a particular application; in an embodiment considered herein, it is used to mean distances from about 10 mm to about 500 mm.

The laser wavelength λ is understood herein as a central wavelength of an optical spectrum of the laser diode radiation for a particular value of a drive current of the laser diode.

The method can be used for suppressing undesirable noise-like interference effects in laser-based devices for optical measurements of components and materials. It can also be used for other purposes when a particular shape of time-averaged spectral profile is required. By way of example only, the method of the present invention will be described with reference to an optical loss meter.

Figure 1:
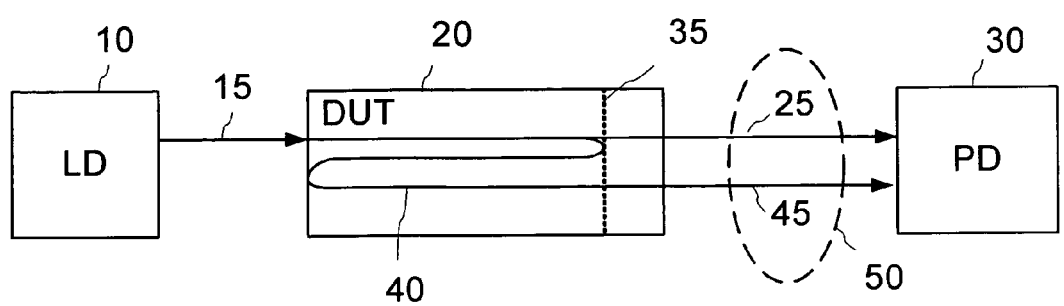
FIG. 1 is a diagram of a prior-art fiber-optic component meter.

Operation of such a device is illustrated in FIG. 1, which shows a light beam 15, emitted by a laser diode 10, impinging on a photodiode 30 after passing through a device under test (DUT) 20, for example a transmissive or reflective fiber optic component having an input and an output port, such as a WDM filter or an attenuator. The DUT 20 has an internal unwanted reflection plane 35, for example an optical fiber facet or a lens facet, which causes internal reflection in the DUT 20 to occur, resulting in a small portion of the beam 15 experiencing multiple reflections within the DUT 20, as schematically illustrated by an S-shaped arrow 40. As a result, a portion 50 of the laser beam 15 which is output from the DUT 20 includes two components: a first component 25 which has passed through the DUT 20 without unwanted reflections, and a second component 45 which experienced the unwanted reflections within the DUT 20. Interference of these two components of the optical beam 50 at the photodiode 30 gives rise to an unwanted noise-like interference component, caused by interference fringes, in a power reading of the photodiode 30. Intensity of this noise-like component is proportional to the interference fringe contrast, which is determined by a normalized coherence function $\Gamma_t(\tau)$ of the laser beam 15, where τ is an optical delay time corresponding to an OPD value l equal to an optical length of the multi-path trajectory 40, i.e. for τ=l/c, where c is the speed of light. The coherence function $\Gamma_t(\tau)$, represented as a function of the OPD l, will be denoted hereinbelow as Γ(l).

It has been known in the art to reduce the undesirable interference effect within the DUT on the power reading by modulating the laser wavelength with a triangular waveform. The method has been applied to wavelength-tunable lasers in general, and to semiconductor laser diodes in particular, where a wavelength modulation is especially easily achieved by modulating their drive current. The method is based on recognition that each power reading can be collected, and often is collected and thereby averaged over a relatively large period of time $T_m$, and that the undesirable effect of the interference fringes can be at least partially obviated by the time averaging, provided that the laser wavelength λ is modulated with a characteristic period, which is at least several times smaller than the duration of the power reading measurement. The time $T_m$ over which one power reading is averaged, typically between a few μsec and one second, is hereinafter also referred to as a measurement time $T_m$.

In mathematical terms, the coherence function $\Gamma_\tau(\tau)$ that affects an amplitude of the undesirable interference component of the power reading, is a time-averaged coherence function, i.e. the coherence function which is averaged over a time period of the measurement. For a typical cw-pumped laser diode, $\Gamma_\tau(\tau)$ is an exponentially decreasing function of the time delay τ, which is characterized by a coherence time $t_c$ corresponding to a coherence length $l_c=ct_c$ between tens of centimeters to tens of meters. On the other hand, the coherence function is the Fourier transform of the optical spectrum of the laser, and the time averaged coherence function $\Gamma_\tau(t)$ is a Fourier-transform of a time-averaged optical spectrum S(ω), where ω=2πν=2πc/λ is a cyclic optical frequency corresponding to the laser wavelength λ. The time-averaged optical spectrum $S(\omega)$ can also be represented as a function $S_\nu(\nu)$ of the optical frequency $\nu$, and a function $S_\lambda(\lambda)$ of the laser wavelength.

Because of the intrinsic properties of the Fourier transform, the coherence time $t_c$ is inversely proportional to a spectral width $\Delta\nu$ of the laser radiation:

$$t_c \sim a/\Delta\nu, \qquad (1)$$

where a is a constant parameter. Equation (1) is equally applicable to the time-averaged values of the coherence time and the laser spectral width, thereby enabling at least partial suppressing the time-averaged interference effects by modulating the laser wavelength to widen the time-averaged optical spectrum.

Figure 2A:
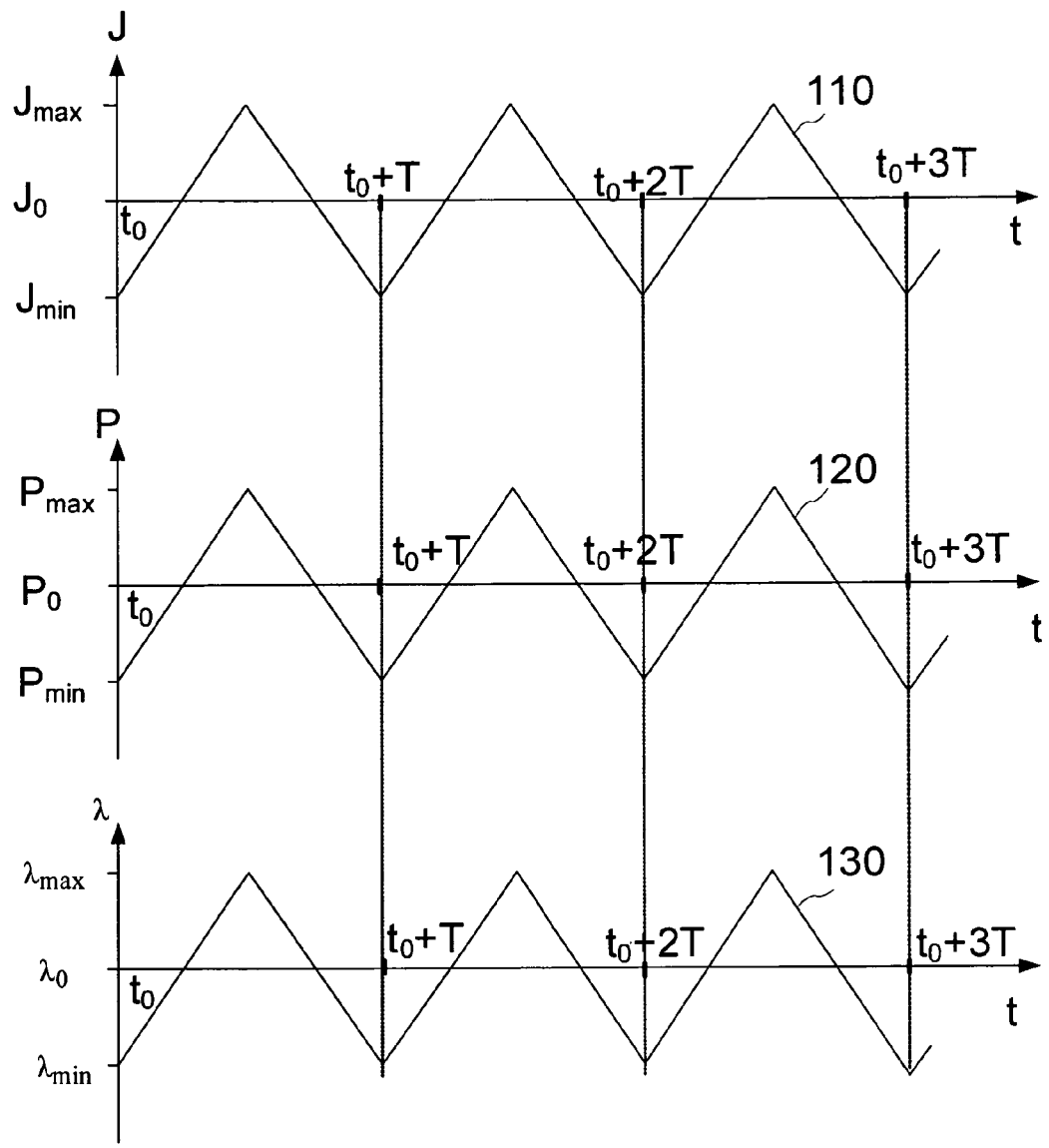
FIG. 2A is a diagram of time dependence of the drive current, optical power, and wavelength for a laser diode modulated with a triangle waveform.
Figure 2B:
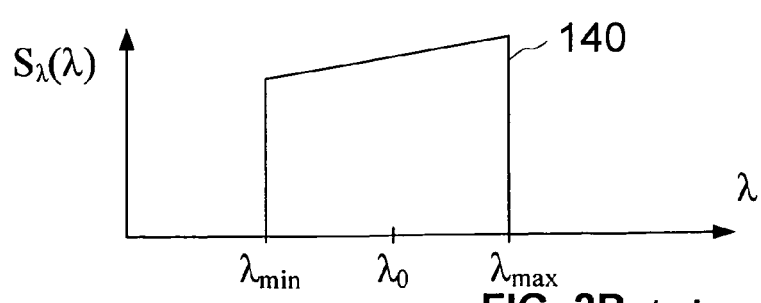
FIG. 2B is a diagram of an averaged optical spectrum for the laser diode modulated with the triangle waveform shown in FIG. 2A.

The prior art method for reducing the undesirable interference effects by reducing the time-averaged coherence of the laser diode radiation is illustrated in FIGS. 2A and 2B. The laser diode drive current J is modulated around a steady-state operating value $J_0$ with a triangular waveform 110 having a period T, so that the drive current of the laser diode changes piece-wise linearly within a drive current interval ($J_{max}$, $J_{min}$) between a minimum value $J_{min}$ and a maximum value $J_{max}$. This triangular modulation leads to a periodic modulation of the laser output power P between a minimum power value $P_{min}$ and a maximum power value $P_{max}$, and also to a periodic modulation of the laser wavelength $\lambda$ between a minimum value $\lambda_{min}$ and a maximum value $\lambda_{max}$, since the laser diode output power and the laser wavelength are known to depend on the laser drive current. Typically, both the laser diode power P and the laser wavelength $\lambda$, change linearly for relatively small changes of the drive current:

$$P(J)=P_0+k_p(J-J_0), \qquad (2)$$

$$\lambda(J)=\lambda_0+k_\lambda(J-J_0), \qquad (3)$$

Coefficients $k_p$ and $k_\lambda$ in equations (2), (3) are typically known, either from a supplier specification or pre-determined by a laser diode calibration procedure. The coefficient $k_p$ is typically referred to as the laser slope efficiency. Accordingly, the triangular modulation of the drive current gives rise to a triangular modulation 120 of the laser power P, and a triangular modulation 130 of the laser wavelength $\lambda$.

A resulting time-averaged optical spectrum $S_\lambda(\lambda)$ of the modulated laser diode is represented in FIG. 2B by a line 140. The spectrum has a trapezoidal shape, and a width in the wavelength domain $$\Delta\lambda=(\lambda_{max}-\lambda_{min})=k_\lambda(J_{max}-J_{min}). \qquad (4)$$

In writing equation (4), it has been assumed that the laser linewidth at each particular moment during the modulation remains much smaller than the spectral width $\Delta\lambda$ averaged over one or more periods of the modulation. In a frequency domain, the averaged laser spectrum has a width $\Delta\nu \approx c\Delta\lambda/\lambda_0^2$, where a relationship $\Delta\lambda \ll \lambda_0$ has been taken into account.

Figure 3A:
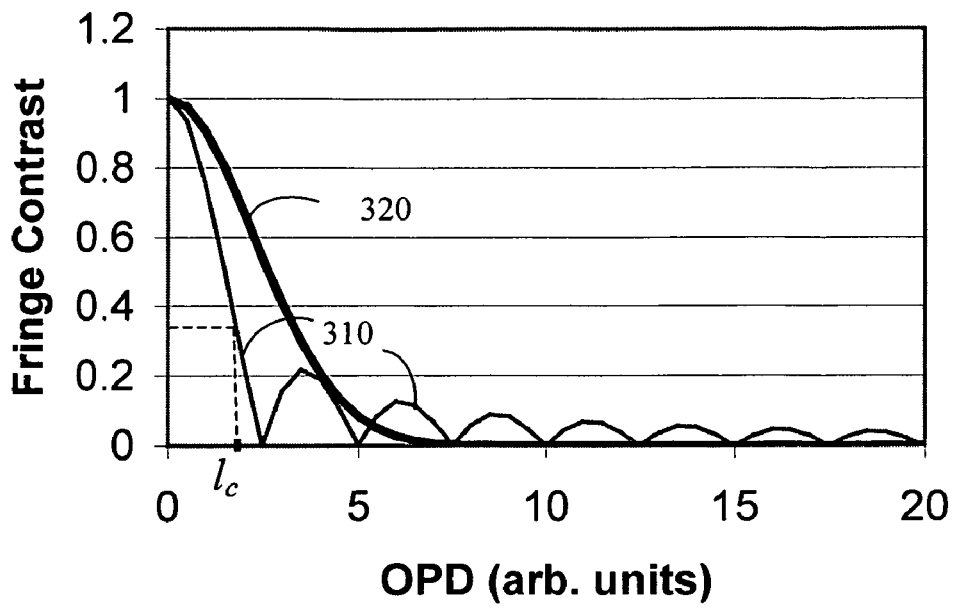
FIG. 3A is a graph showing coherence functions corresponding to spectral profiles shown in FIG. 3B.

The trapezoidal spectral profile of the time-averaged laser diode spectrum, although leading to a reduced coherence time $t_c = a\lambda_0^2/c\Delta\lambda$ and a correspondingly reduced coherence length $l_c = t_c/c = a\lambda_0^2/\Delta\lambda$, is not optimal when suppression of the interference fringes beyond the coherence length is desired. With reference to FIG. 3A, a normalized coherence function $\Gamma(l)$ 310, calculated from the trapezoidal spectral profile 140 and referred to in the figure as the fringe contrast, has a series of peaks of decreasing amplitude beyond the coherence length $l_c$. These peaks of the fringe contrast at OPD values exceeding the coherence length $l_c$, although relatively small in amplitude, extend far towards large OPD values, and can cause measurable errors when the laser diode's radiation is used for optical probing of a component or a material.

The present invention improves on the prior art by providing an optimized modulation function to reduce interference effects for OPD values beyond the coherence length $l_c$.

The method starts by recognizing that the slow decay of the fringe contrast with increasing OPD for the prior-art modulation waveforms stems from large discontinuities of the averaged spectral profile 140 of the laser radiation at the edges $\lambda_{min}$ and $\lambda_{max}$ of the wavelength modulation span. To obtain a coherence function which falls off rapidly with increasing OPD, we need to avoid these large discontinuities in the optical spectrum. A spectral profile which has the Fourier transform falling off most rapidly is a Gaussian profile. Therefore, in one preferred embodiment the objective is to modulate the laser in such a way that the time-averaged frequency spectrum $S_\nu(\nu)$ has a target spectral profile that approximates a Gaussian profile, i.e. the following relation holds:

$$S_\nu(\nu) \cong \exp\left(-\left(\frac{\nu-\nu_0}{\delta\nu/2}\right)^2\right), \qquad (5a)$$

with a corresponding wavelength spectrum $$S_\lambda(\lambda) \cong \exp\left(-\left(\frac{\lambda-\lambda_0}{\delta\lambda/2}\right)^2\right), \qquad (5b)$$

with each of the spectral widths $\delta\nu$ and $\delta\lambda=c\delta\nu/\nu^2$ defined here as a full width of the corresponding Gaussian spectral profile at a $1/e \sim 0.37$ level thereof. Note that the Gaussian shape of the wavelength spectral profile $S_\lambda(\lambda)$ defined by equation (5b) results from the Gaussian shape of the frequency spectral profile $S_\nu(\nu)$ defined by equation (5a), provided that $\Delta\lambda \ll \lambda$, which is typically the case.

Figure 3B:
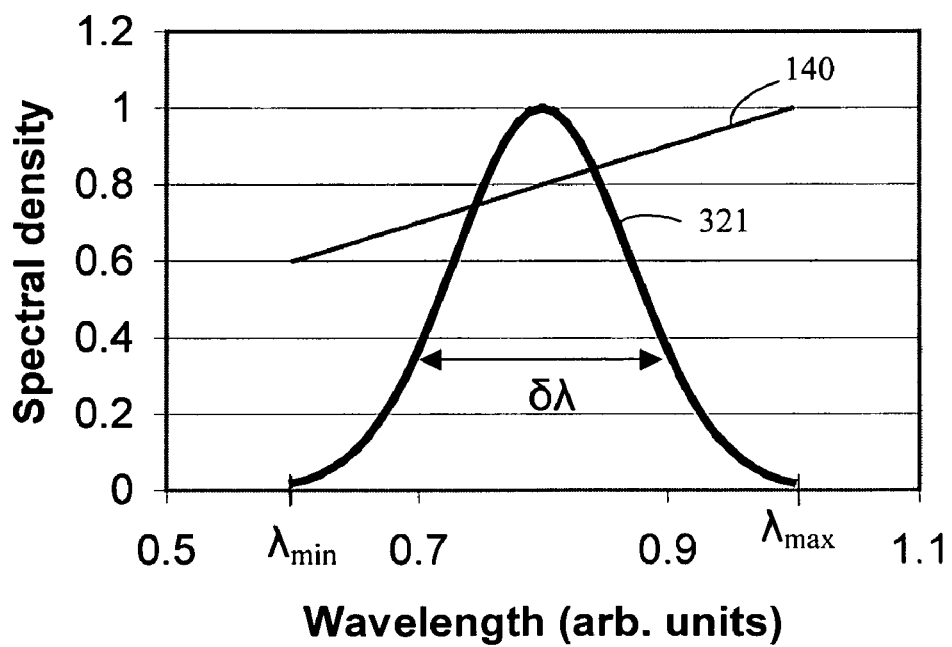
FIG. 3B is a graph showing a Gaussian and a trapezoidal spectral profiles of a laser radiation.

The target Gaussian wavelength spectral profile $S_\lambda(\lambda)$ is shown in FIG. 3B by a solid line labeled "321", where it is given in comparison with the trapezoidal spectral profile 140 of the prior art. The wavelength spectral width $\delta\lambda$ for the Gaussian profile 321 is selected here to be about one half of the full wavelength modulation span $\Delta\lambda$, which satisfies equation (4). It is not possible to match the Gaussian profile exactly due to hardware limitations of the laser driver, and because the Gaussian function extends to plus and minus infinity, whereas there is only a finite wavelength tuning range available through current modulation of the diode laser. Nevertheless, we can generate a reasonable approximation.

Turning back to FIG. 3A, the coherence function 320 corresponding to the Gaussian averaged spectral profile 321 is shown to roll off much faster than the prior-art coherence function 310 at medium to large OPD values, beyond approximately $2 l_c$, where $l_c$ is a characteristic time-averaged coherence length for the prior-art triangular wavelength modulation waveform 130. The coherence function 320 has an approximately Gaussian shape defined by equation (6b), with a characteristic coherence length $l_{gc}$, as defined at $1/e$ level of the coherence function, satisfying equation (6a):

$$l_{gc}=2c/(\pi\delta\nu)=2\lambda^2/(\pi\delta\lambda), \qquad (6a)$$

$$\Gamma_{g\lambda} \approx \exp[-(l/l_{gc})^2] \qquad (6b)$$

Although the Gaussian spectral profile of the time-averaged optical spectrum of the laser radiation corresponds to the fastest roll-off of the coherence function at large OPD values, Gaussian-like spectral profiles that gradually roll off towards the edges of the spectrum without large discontinuities at the edges, including various bell-shaped profiles such as of the Lorentzian type that results in the exponential decay of the coherence function, also have superior coherence suppression properties at large OPD values compared to those provided by the prior-art triangular modulation that results in the trapezoidal spectrum. Accordingly, modulation functions resulting in such bell-shaped spectral profiles of the time-averaged spectrum of the laser radiation may be used for coherence reduction of the laser diode radiation in alternative embodiment of the invention.

The current invention provides a method of modulation of the drive current of a laser diode for obtaining laser radiation having a target time-averaged spectral profile, by first determining a modulation function for the drive current, including determining a shape of the modulation function from the target time-averaged spectral profile, and, second, by modulating the drive current of the laser diode using said modulation function. In a preferred embodiment, the target time-averaged spectral profile is substantially Gaussian, as required for the optimal reduction of the laser coherence; alternative embodiments can utilize as the target other spectral profiles that gradually roll off towards the edges of the spectrum without substantial discontinuities, or abrupt spectral changes, such as other Gaussian-like bell-shaped profiles or even a triangular spectral profile.

We note here that the conventional methods of laser coherence reduction, e.g. the aforedescribed triangular modulation method, do not include the step of determining the shape of the laser modulation function from a target time-averaged spectral profile. Instead, the prior art methods typically start with defining the drive current modulation waveform, e.g. the triangular waveform or a sinusoidal waveform, and then proceed to determine the current modulation span $\Delta J$ required for obtaining a certain spectral width $\Delta\lambda$, e.g. using equation (4) or a similar equation for the current dependence of the laser wavelength, for providing a sufficiently small coherence length $l_c$ as required for a particular application.

Contrary to the prior art methods, the determining of a shape of the current modulation function $J(t)$ lies in the heart of the method of the present invention.

Figure 4:
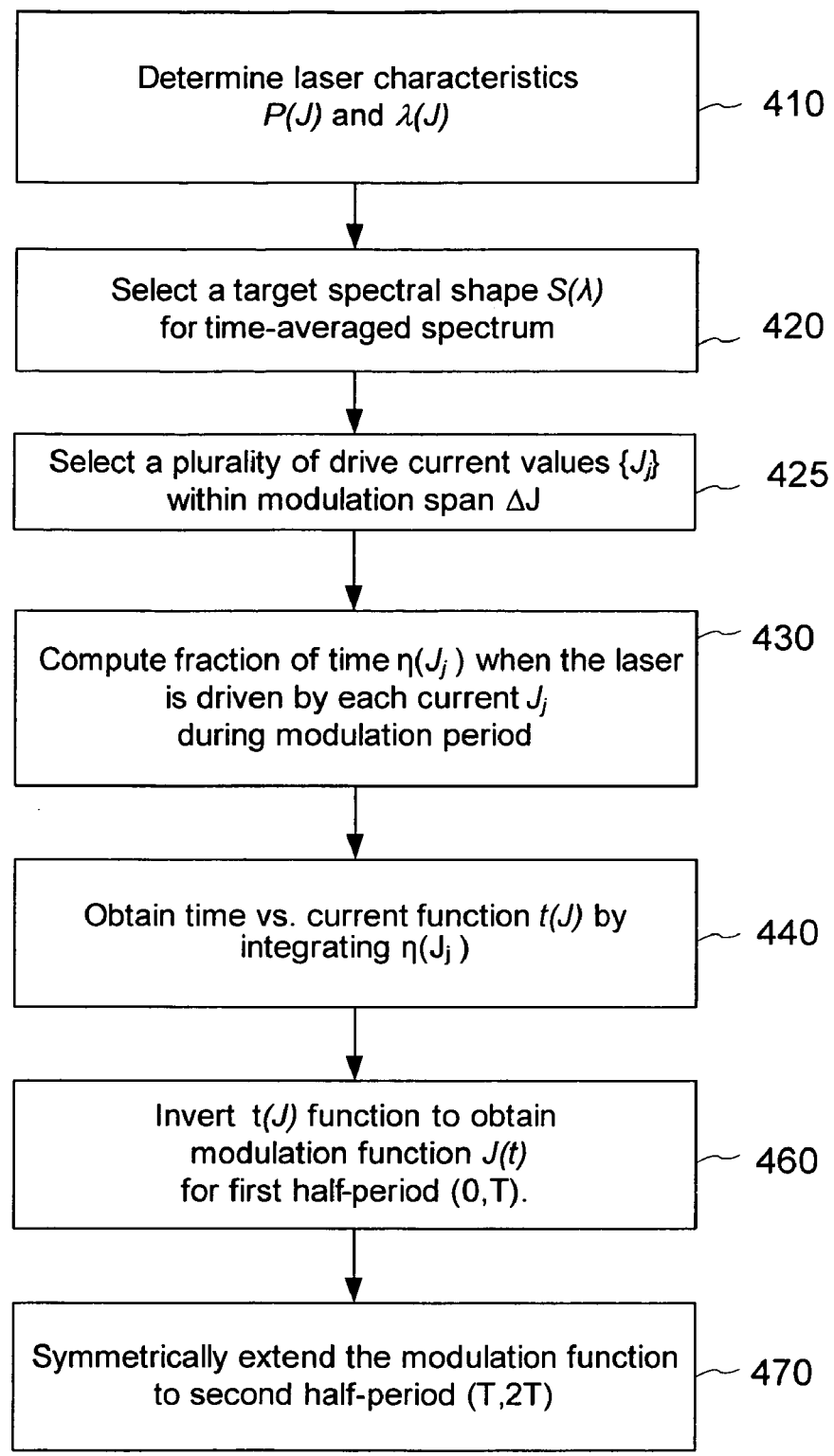
FIG. 4 is a block diagram of the method of the present invention for determining a modulation function for the laser drive current.
Figure 6:
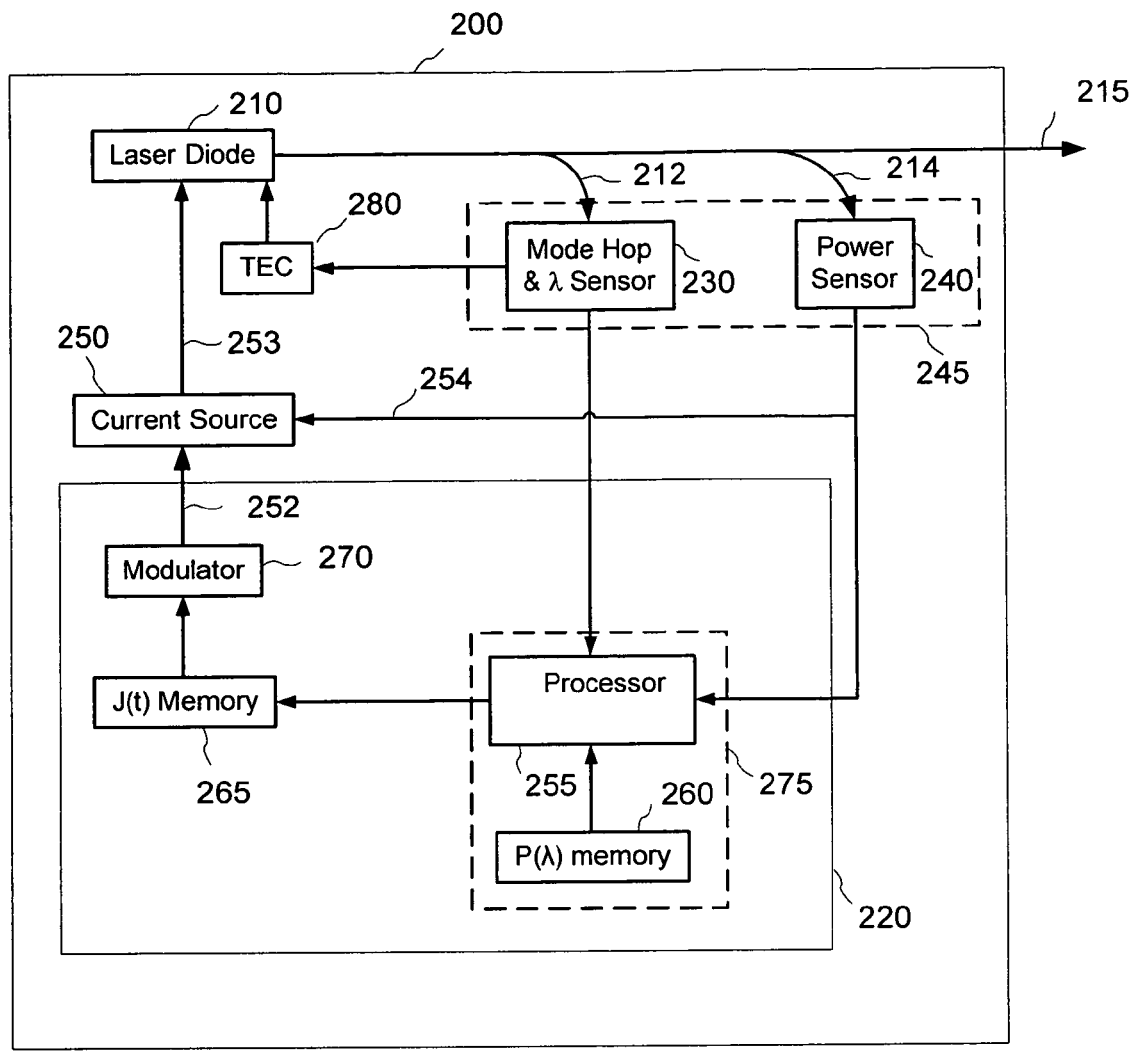
FIG. 6 is a block diagram of the laser apparatus according to the present invention.

A preferred embodiment of the method of modulation of a drive current of a laser diode for obtaining laser radiation having a target time-averaged spectral profile will now be discussed with reference to FIG. 4, showing a block diagram of the method embodiment, and to FIG. 6, showing an exemplary embodiment of a laser apparatus realizing said method.

With reference to FIG. 4, in a first step 420 of the method, the laser diode characteristics relevant for the laser diode modulation method of the present invention are determined within an operating range of the laser diode, namely the dependences $\lambda(J)$ and $P(J)$ of the laser wavelength and output power, respectively, on the laser diode drive current J. This step is optional; for example, in some embodiments these dependences may be pre-determined at an earlier calibration stage, stored in a memory device and provided to the method therefrom.

In a next step 420, the target spectral profile of the time-averaged spectrum is selected. In the preferred embodiment of the method, the target profile is selected for optimally reducing the time-averaged coherence function as described hereinabove, and within the wavelength modulation span $(\lambda_{min}, \lambda_{max})$ approximates the Gaussian profile, as described by equation (5a) in the wavelength domain, and by equation (5b) in the frequency domain. Hereinafter in this specification, the subscripts "v" and "λ" of the spectral profile functions $S_\lambda(\lambda)$ and $S_v(v)$ will be for simplicity omitted.

For certainty, herein in this specification we chose to described the method in terms of the wavelength, although those skilled in the art would appreciate that the method can be both described and computationally implemented using either of the following parameters, which will be hereinafter referred to as frequency parameters: the laser wavelength $\lambda$, the laser frequency $v$, and the laser cyclic frequency $\omega$.

Continuing the description of the method steps, step 420 also includes selecting the width $\Delta\lambda=(\lambda_{max}-\lambda_{min})$ of the wavelength modulation span determining the total width of the target time-averaged laser spectrum $S(\lambda)$, and selecting a characteristic spectral width $\delta\lambda$ thereof at a pre-determined intensity level. In the preferred embodiment, the characteristic spectral width $\delta\lambda$ is the full width of the Gaussian function at the 1/e level as defined by equation (5a). Particular values of the parameters $\Delta\lambda$ and $\delta\lambda \leq \Delta\lambda$ are selected depending on requirements of a particular application, taking into account an allowable value of the modulation span $\Delta J$ of the drive current, and a target suppression of the fringe contrast for OPD values relevant for the application. Generally, increasing the ratio $\delta\lambda/\Delta\lambda$ leads to a faster initial roll-off of the coherence function $\Gamma(l)$, at the expense of a less steep coherence roll-off at larger OPDs beyond the coherence length, as in the case of the triangular modulation. Decreasing of this ratio, on the contrary, widens the central peak of the coherence function, but enhances the suppression of the $\Gamma(l)$ "tail" for larger OPD values.

By way of example, selecting the target time-averaged profile $S(\lambda)$ so to satisfy equation (5a) with $\delta\lambda \sim 0.5 \cdot \Delta\lambda$ for $\lambda_{min} < \lambda < \lambda_{max}$, and to equal zero outside of this interval, leads to relatively small, less than 2%, discontinuities of the averaged spectrum at the edges thereof, and to a reasonably high suppression of the coherence function at large OPD values. In practice, physical limitations of a current source and a modulator require that $S(\lambda)$ to be above a certain minimum value over the range $\lambda_{min} < \lambda < \lambda_{max}$, otherwise the rate of change of the drive current would exceed capabilities of the current source and modulator. Thus, the truncated Gaussian profile for $S(\lambda)$ is appropriate for minimizing the coherence of the laser as well as matching the physical requirements of the apparatus.

Figure 5A:
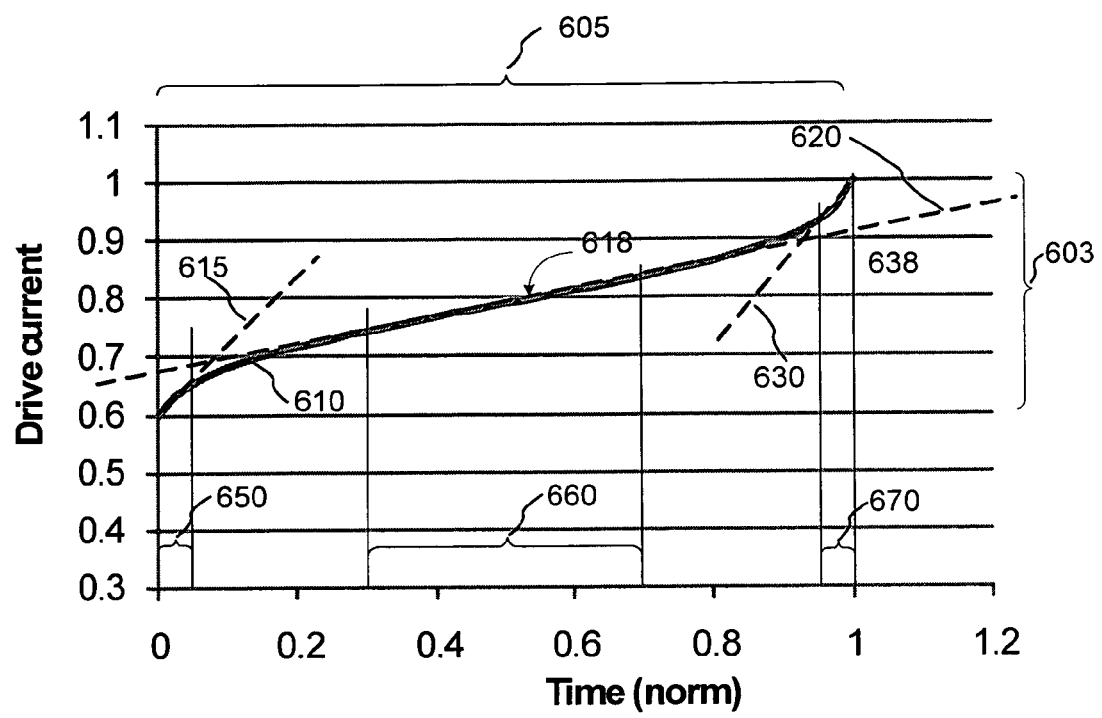
FIG. 5A is a graph showing the modulation function of the present invention obtained using the Gaussian function shown in FIG. 3B as the target spectral profile.

In order for the laser wavelength to vary during the modulation from $\lambda_{min}$ to $\lambda_{max}$, the drive current of the laser diode has to vary within the drive current interval $(J_{max}, J_{min})$ from a minimum drive current value $J_{min}$ to a maximum drive current value $J_{max}$. The drive current interval $(J_{min}, J_{max})$, which includes all currents from $J_{min}$ to $J_{max}$, is also referred to hereinafter as the current modulation interval, or simply as the modulation interval, with the difference $\Delta J = J_{max} - J_{min}$ referred to as the current modulation span. The selection of the wavelength modulation range $(\lambda_{min}, \lambda_{max})$ is tied to the selection of a suitable drive current interval $(J_{max}, J_{min})$ that is within the operation range of the laser diode, and is done using the pre-determined dependence $\lambda(J)$ of the laser wavelength $\lambda$ upon the drive current J. Once the target spectral profile is selected and the current modulation interval $(J_{minx}, J_{max})$ is identified, the modulation function $J(t)$ for the drive current of the laser diode that provides in the target spectral profile can be determined using the dependences $P(J)$ and $\lambda(J)$ as described hereinbelow. The modulation function $J(t)$ as used in this specification is defined over a time interval of duration T, which is the time interval wherein the drive current of the laser diode varies from $J_{min}$ to $J_{max}$ so as to result in the spectral profile $S(\lambda)$ of the optical spectrum of the laser radiation when averaged over the time interval T. This time interval is also referred to hereinafter as the modulation time span. An example of the modulation function J(t) normalized to $J_{max}$ is shown in FIG. 5a versus a normalized time t/T.

Figure 5B:
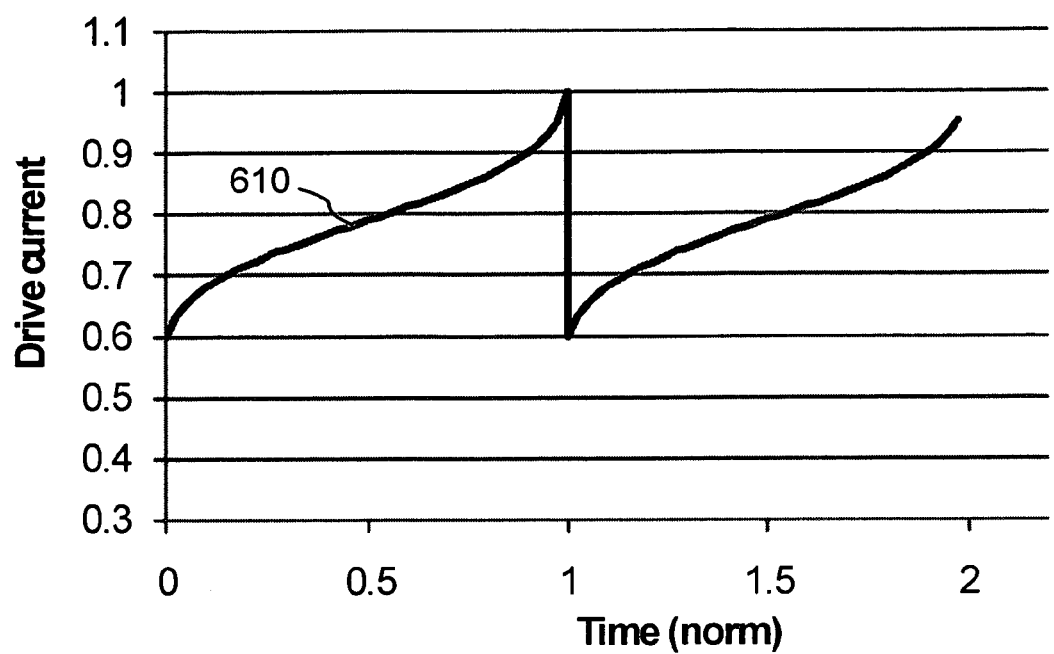
FIG. 5B is a graph showing a saw-tooth modulation waveform obtained from the modulation function shown in FIG. 5A.

In preferred embodiments, the modulation function J(t) is periodically applied to the drive current resulting in a periodic modulation of the drive current with a period either T or 2T as described hereinafter with reference to FIGS. 5A and 5B, respectively. Particular values of the duration T of the modulation time interval depends on the application, but it must be short enough compared to the averaging time $T_m$, i.e. $T < T_m$, and longer than the laser diode latency in settling to a particular laser wavelength when the drive current is changed. By way of example, T may be in the range from a few microseconds to tens of milliseconds.

In a next step 425, a plurality $\{J_j\}$ of N drive current values $J_j$, j=0 . . . N−1, is selected, the plurality spanning the drive current interval $(J_{min}, J_{max})$. For example, the N drive current values can be uniformly spaced within the drive current interval, satisfying a relation $J_j = J_{min} + j \cdot \Delta J/N$ for j=0 . . . N−1. The integer number N is preferably in the range between 20 and 1000.

In a step 430, a normalized fraction of time $\eta(J_j)$, when the drive current has a particular value $J_j$ is determined for each drive current from the plurality $\{J_j\}$, using the known dependences $\lambda(J)$ and P(J) of the laser wavelength on the drive current, and the laser optical power on the drive current, respectively.

This normalized fraction of time, or time fraction $\eta(J_j)$ may be determined using the following equation (7):

$$\eta(J_j) = \frac{S(\lambda(J_j))\frac{d\lambda}{dJ}}{P(J_j)}, \quad (7)$$

Computationally, the plurality of time fraction values $\eta(J_j)$, j=0, . . . , N−1, can be obtained by performing the following steps:

i) determining a first plurality of optical power values $\{S_j\}$ from the target spectral shape $S(\lambda)$ and the pre-determined dependence of the laser wavelength on the drive current $\lambda(J)$, e.g. using the equation $$S_j = S(\lambda(J_j))\frac{d\lambda}{dJ}, \quad j = 0, \ldots N-1; \text{ and,}$$

ii) dividing the first plurality of optical power values by a second plurality of optical power values $\{P_j\}$, determined from the laser power dependence on the drive current P(J) as $P_j = P(J_j)$. This step can be omitted if P(J)=const.

In a next step 440, the plurality of time fractions $\eta(J_j)$ is used to determine an inverse modulation function t(J) by determining a plurality of time values $\{t_j\}$, $t_j = t(J_j)$, j=0, . . . N−1, corresponding to the plurality of drive current values $\{J_j\}$. For continuous functions, this inverse modulation function t(J) can be computed by integration of a function $\eta(J_j)$:

$$t(J) = t_0 + \frac{T}{J_{max} - J_{min}} \int_{J_{min}}^{J} \eta(i) \, di, \quad (8a)$$

and corresponds to one modulation time span from $t_0$ ($t_0 +$T), where $t_0$ is a time offset. Using the computed discrete function $\eta_j = \eta(J_j)$, the plurality of time values $\{t_j = t(J_j)\}$ is determined using the following equation (8):

$$t_j = t(J_j) = t_0 + \sum_{k=0}^{j} \eta_k \text{ for } j = 0, \ldots N-1. \quad (8b)$$

Equation (8b) defines the discrete inverse modulation function $t(J_j)$ as the plurality of pairs $\{t_j, J_j\}$, j=0, . . . N−1, of the time and drive current values. In a next step 460, the discrete-valued inverse modulation function $t(J_j)$ is inverted to determine the modulation function J(t). This can be done, for example, by saving the plurality of pairs $\{t_j, J_j\}$ in a two-column look-up table, and then inverting the column order. However, the resulting discrete-valued modulation function J ($t_j$) is defined for the plurality of time values $\{t_j\}$ that are not equally spaced in time. If it is desired that the modulation function J(t) is defined for a plurality of equally spaced drive current values or for any time instance within the modulation time span ($t_0$, ($t_0$+T)), it can be easily done by interpolating the discrete-valued modulation function J ($t_j$) computed from equation (8b) to any desired time moment t within the modulation time span between $t_0$ and ($t_0$+T), thereby obtaining the desired modulation function J(t) or its digital representation defined for any suitable plurality of time instances within the modulation time span.

One example of the modulation function J(t) computed according to the aforedescribed method is illustrated in FIG. 5A with a curve 610. For convenience of illustration the modulation function 610 is normalized by the maximum drive current $J_{max}$ and is shown in dependence on the normalized time t/T. The exemplary modulation function 610 shown in FIG. 5A was computed using the Gaussian target spectral profile $S_\lambda(\lambda)$ of equation (5b) with $\delta\lambda$=0.625 $\Delta\lambda$, as shown in FIG. 3B, assuming $J_{min}$=0.6 $J_{max}$ and typical linear dependences of the laser power P(J) and the laser wavelength $\lambda$ (J) on the drive current, as described by equations (2) and (3).

Figure 5C:
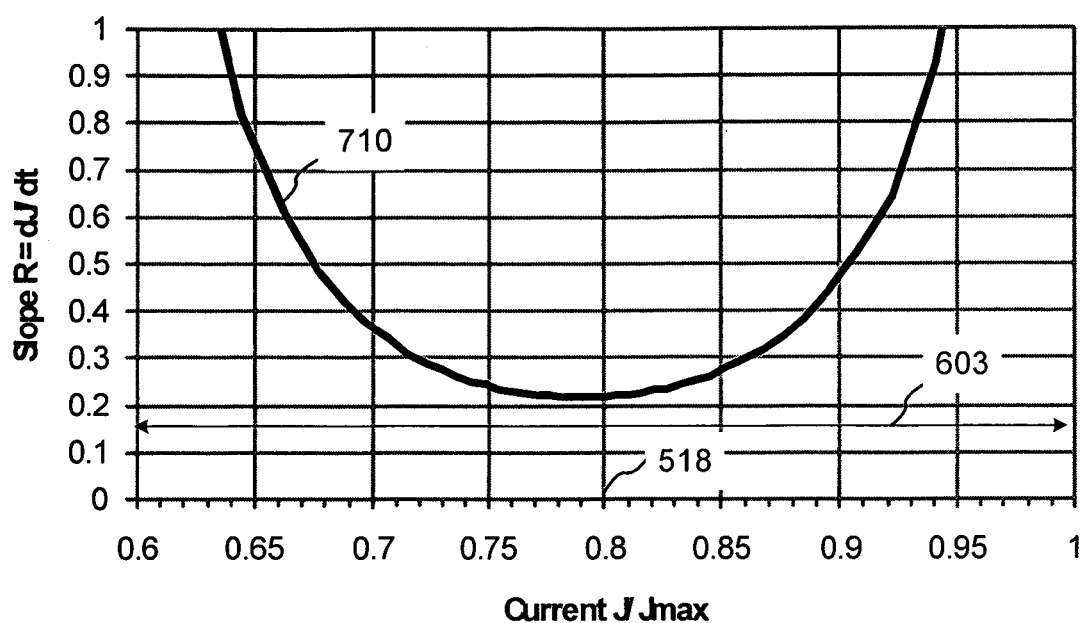
FIG. 5C is a graph showing a symmetrical modulation waveform obtained from the modulation function shown in FIG. 5A.

The modulation function 610 corresponds to the drive current that monotonically increases with time from the minimum value $J_{min}$ at a time instance $t_{min} = t_0 = 0$ to the maximum value $J_{max}$ at a time instance $t_{max}$=T. This function can be periodically applied to the drive current with a period equal to the modulation time span T, resulting in a saw-tooth like modulations waveform such as the waveform 620 shown in FIG. 5B. However, it may be preferable to have a modulation waveform that is substantially continuous and does not have abrupt steps. In such embodiments, the modulation function J(t) is symmetrically extended in the last step 470 of the method of FIG. 4 into a consecutive time interval (T+$t_0$, 2T+$t_0$), to obtain a symmetrical modulation waveform such as the waveform 520 shown in FIG. 5C. The laser drive current is then modulated by periodically repeating the modulation waveform 520 in time with the period 2T. The symmetrical modulation waveform 520 computed by the aforedescribed method using the Gaussian profile 321 shown in FIG. 3B as the target time-averaged spectral profile $S(\lambda)$ is shown in FIG. 5C in comparison with the conventional triangular modulation waveform 510.

The periodic application of the modulation function J(t) 610 to the laser diode drive current provides the desired substantially Gaussian shape of the time-averaged spectral profile of the laser diode radiation and the associated suppression of the undesired coherence peaks at large OPD values, provided that the laser wavelength follows the drive current in accordance with the pre-determined dependence $\lambda(J)$ without substantial delay. The description hereinabove with reference to FIG. 4 relates to one method of obtaining this function. In other embodiments of the present invention the desired modulation function J(t) can be obtained using variations of this methods or alternative methods, for example based on a trial and error approach.

In particular, we found that the modulation function J(t) that results in a time-averaged spectral profile S(λ) satisfies the following equation (9), and can be found by solving this equation:

$$\frac{dJ(t)}{dt} = \frac{C}{T} \frac{P(J)}{S(\lambda(J)) \frac{d\lambda(J)}{dJ}} \tag{9}$$

where functions P(J) and λ(J) correspond to the pre-determined dependencies of the instantaneous output optical power of the laser diode and its wavelength on the drive current, such as those defined by equations (2) and (3), and C is a normalization constant that can be determined from the requirement that the time span of the modulation function J(t) equals T. One skilled in the art will appreciate that the process of computing J(t) described hereinabove is one method of solving equation (9), and that other methods of solving this equation can also be used within the scope of the current invention to determine the modulation function J(t).

Furthermore, modulation functions that result in spectral profiles of the time-averaged laser spectrum that deviate from the Gaussian shape of equations 5a and 5b, but are generally Gaussian-like and bell-shaped, can also be used to reduce the coherence of the laser diode radiation according to the present invention, and to suppress the undesirable peaks in the laser coherence at large OPD values. It may be therefore instructive to analyze the modulation function 610 in order to understand the properties that the modulation function J(t) may posses for the purpose of coherence reduction according to the present invention.

Figure 5D:
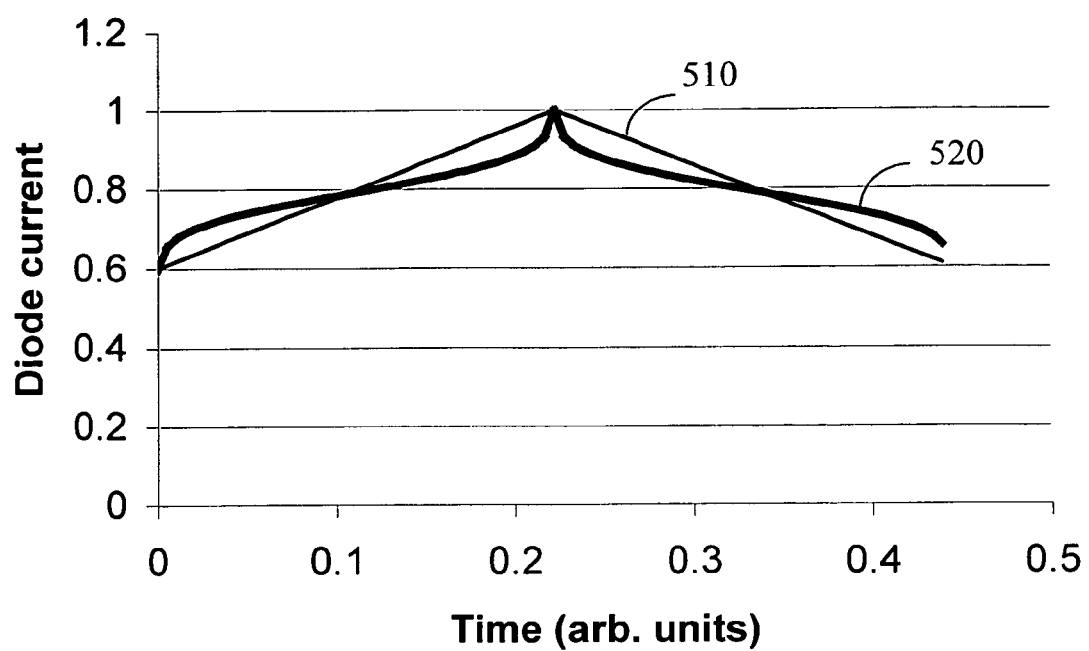
FIG. 5D is a graph showing the slope of the modulation function shown in FIG. 5A versus the modulation current within one modulation current interval.

We found that the spectral density of the time-averaged spectrum of the modulated laser radiation at a wavelength λ is approximately inversely proportional to the slope R=dJ(t)/dt of the used modulation function J(t) at the drive current value corresponding to the wavelength λ. This slope is shown in FIG. 5D with a curve 710 as a function of the normalized drive current. As seen from FIGS. 5A and 5C, the slope R of the modulation function 610 has its minimum at the middle point 618 of the current modulation interval 603, which in the shown example corresponds to a drive current $J_m=(J_{max}+J_{min})/2=0.8\,J_{max}$, and increases away from the middle point 618 towards the edges of the modulation interval 603, with the rate dR/dJ of this slope increase being the greater the further away is the modulation current from the middle 618 of the modulation interval 603.

Advantageously, this property of the modulation function 610 results in the desired bell-shaped time averaged spectral profile wherein the spectral density gradually decreases away from the center wavelength $\lambda c = \lambda(J_m)$ without large discontinuities. This property can be conveniently expressed by comparing an average value $R_{edge}$ of the slope R of the modulation function at the edges of the modulation interval $(J_{min}, J_{max})$ 603 to an average value thereof. $R_{mddl}$ at the middle of the modulation span 603. Dashed lines 615, 620 and 630 in FIG. 5A illustrate average slopes of the modulation function 610 at the lower edge, the middle, and the upper edge of the current modulation interval 603, respectively, with $R_{edge}$ defines as the average of the slopes of the lines 615 and 630.

Preferably, the modulation function J(t) should be such that $R_{edge}$ exceeds $R_{mddl}$ by more than 2 times, when $R_{edge}$ is computed by averaging over the first 5% and last 5% of the modulation time span 605, and the average value $R_{mddl}$ is computed by averaging over a center third of the modulation time span 605:

$$R_{edge} > 2R_{mddl}, \tag{10}$$

$$R_{edge} = [J(t\min+\delta T)-J(t\min)]/(2\delta T)+[J(t\max)-J(t\max-\delta T)]/(2\delta T), \tag{11}$$

$$R_{mddl} = [J(t_{max}-T/3)-J(t_{min}+T/3)]/(T/3). \tag{12}$$

where in equation (10) δT=0.05T.

It may be further preferable that the modulation function J(t) is such that $R_{edge}$ is more than 5 times greater than $R_{mddl}$, i.e. the following condition (13) is satisfied:

$$R_{edge} > 5R_{mddl}, \tag{13}$$

wherein now $R_{edge}$ is computed by averaging over the first 2% and last 2% of the modulation time span 605, i.e. using equation (11) with δT=0.02T, and the average value $R_{mddl}$ is again computed by averaging over the center third of the modulation time span 605, for example using equation (12).

Accordingly, one aspect of the invention provides a method of coherence reduction for a laser diode which includes periodically modulating the drive current J of the laser diode within a current modulation interval $(J_{min}, J_{max})$ between the minimum drive current $J_{min}$ and the maximum drive current $J_{max}$ using a modulation function J(t) that is characterized by a greater slope at the edges of the current modulation interval $(J_{min}, J_{max})$ than in the middle thereof, so as to provide laser radiation with an optical spectrum having a Gaussian-like shape when averaged over at least one modulation time span.

In particular, the modulation function J(t) that has the slope R that gradually rises, preferably at an increasing rate, away from the middle of the current modulation interval towards the edges thereof and satisfies the conditions (10)-(12) with δT=0.05T, and preferably the conditions (11)-(13) with δT=0.02T, results in a time-averaged spectral profile of the laser radiation that gradually decreases towards the edges thereof and has a substantially Gaussian-like shape, resulting in a substantially decreased coherence of the laser radiation at large OPD values as compared to the prior-art triangular modulation.

Turning now to FIG. 6, a laser apparatus 200, implementing the aforedescribed method of the present invention of coherence reduction for the laser diode radiation will now be described.

FIG. 6 shows the block diagram of the laser apparatus 200. Various blocks shown in FIG. 6 are to be understood as functional blocks rather than as separate pieces of equipment unless stated otherwise, and can be realized in hardware or software or a combination thereof, depending on a particular implementation, and may include one or more integrated circuit (IC) chips and one or more additional optical components. Best embodiment of each block shown in FIG. 6 may depend on particular application and would be known to those skilled in the art after reading this specification.

The laser apparatus 200 includes a laser diode 210 which emits laser radiation via an output optical fiber 215, a current source 250 for supplying a drive current to the laser, and modulating means 220 for modulating the drive current using a modulation function J(t), which is determined from the target spectral profile S(t) using the aforedescribed method of the present invention.

The laser diode 210 has a wavelength λ of the laser diode radiation, which is dependent on the drive current J of the laser 210 in a known manner, and an optical power P, which is also dependent on the laser drive current in a known manner. These dependences P(J) and λ(J) can typically be approximated by linear functions given by equations (2), (3); the linear approximation is however not a requirement for the present invention.

The current source 250 has a modulation input for receiving a periodic analog or digital modulation signal 252, and an output for supplying the drive current 253 to the laser diode 210. It has also an optional input for receiving a power feedback signal 254 from an optional power sensor 240. The drive current 253 is a continuous, or analog, signal formed as a periodical extension of the modulation function J(t).

The modulating means 220 can be embodied as any suitable signal generator; it includes: a modulator block 270 for generating the periodic modulating signal 252 using the modulation function J(t), the periodic signal 252 used by the current source 250 for periodically modulating the laser drive current 254; a first memory block 265 for storing the modulation function J(t) in a digitized form. In some embodiments, the modulating means 220 includes means 275 for adjusting the modulation function J(t) in response to a change in the drive current dependence of one of the laser power P(J), and the laser wavelength λ(J). The means 275 are formed by processing means 255, and a second memory block 260 for storing the target spectral shape S(λ). The processing means 255, hereinafter also referred to as a processor 255, can be embodied using a micro-processor, a digital signal processor, and/or an FPGA device.

In some embodiments, the modulation function J(t) is pre-determined at a stage of calibration of the laser apparatus 200 from the target time-averaged spectral shape S(λ), using the method of the present invention as described hereinabove with reference to FIG. 4, and the pre-determined dependencies P(J) and λ(J) for the laser diode 200, e.g. by performing the steps of:

A) for a plurality of drive current values $\{J_j\}$ within a drive current interval ΔJ, determining a first plurality of optical power values $\{S_j\}$ from the target spectral shape S(λ) and the pre-determined dependence λ(J) of the laser wavelength on the drive current;

B) dividing the first plurality of optical power values by a second plurality of optical power values $\{P(J_j)\}$ determined from the laser power dependence P(J) on the drive current, by dividing each power value $S_j$ from the first plurality by a corresponding power value $P(J_j)$ from the second plurality, to obtain a plurality of time fraction values $\{\eta(J_j)=S_j/P(J_j)\}$;

C) determining a plurality of time values $\{t_j\}$ corresponding to the plurality of drive current values $\{J_j\}$ from the plurality of time fraction values $\{\eta(J_j)\}$ to obtain a discrete time versus current function $t_j=t(J_j)$; and D) inverting the discrete time versus current function.

Alternatively, other approaches to solving equation (9) may also be used.

In a preferred embodiment, the drive current interval ΔJ is chosen by first determining the wavelength modulation span Δλ to provide a suitably reduced coherence length $l_{gc}$ as described hereinabove in the specification, and then by calculating the drive current interval ΔJ from the pre-determined laser characteristics.

By way of example, the laser diode 210 is a Hitachi 7859MG laser diode having following nominal characteristics: lasing wavelength λ~780 nm, slope efficiency $k_p$~0.65 mW/mA, wavelength vs. current coefficient $k_λ$~0.003 nm/mA, wavelength vs. temperature coefficient $k_T$~0.3 nm/deg C. The target spectral profile is the Gaussian function defined by equation (5a), with δλ=Δλ/2. An application requires the coherence length of the time-averaged coherence function $l_{gc}$≦2 cm. Using equation (6a), the modulation wavelength span Δλ=2δλ≧0.04 nm, and the required current interval ΔJ of the modulation is calculated as $ΔJ=Δλ/k_λ$≧13.3 mA.

In some embodiments, the laser apparatus 200 may also include optional optical sensing means 245 coupled to the fiber-optic laser output 215, the optical sensing means 25 including one or more of the following optical sensors: an optical power sensor 245, a mode hope sensor, and a wavelength sensor, with the later two shown in FIG. 6 combined in a single mode hop and wavelength sensor 230. These sensors have a function of monitoring the drive current dependences of the laser power P(J) and the laser wavelength λ(J) during the laser operation for sensing a change in either the P(J) or λ(J). They provide feedback information to the processor 255 for suitably updating the modulation function J(t), e.g. if a change in the P(J) or λ(J) characteristic is detected.

The laser diode 210 may experience mode hops when the drive current deviates outside a mode hop free range; these mode hops tend to reduce the effectiveness of the optimized modulation of the drive current according to the method of the present invention. To overcome this potential problem, the laser apparatus 200 includes a mode hop sensor 230, which is optically coupled via a tap 212 to the fiber-optic laser output 215 for receiving a portion of the laser radiation, an electrically coupled to a thermo-electric controller (TEC) 280 of the laser diode. The TEC 280 provides means for adjusting the central laser wavelength $λ_0$ by adjusting the laser diode temperature.

Once the mode-hop sensor 230 senses, or detects, a mode-hop event, a signal is sent to the TEC 280 for controlling the laser temperature so that the laser operates in a region free of mode hops. The TEC 280 may receive this signal either directly from the mode-hop sensor 230 as shown in FIG. 6, in which case the mode hop detector 230 may include a TEC control circuit, or via the processor 255. The mode-hop sensor 212 can be embodied using a Fabry-Perot etalon or other wavelength-dependent optical element, followed by a photo-diode and a differentiator circuit. Such a mode-hop sensor is described, for example, in a Canadian Patent Application CA 2,222,002, in the name of the inventor of the current invention, which is included herein by reference. A large positive or negative spike from the differentiator circuit would indicate that a laser mode hop had occurred. By identifying the timing of the mode hop relative to the modulation signal, it can be deduced whether the laser temperature should be increased or decreased to avoid the mode hop. By suitable changing the laser temperature, the temperature dependence of the laser diode wavelength is exploited for adjusting the wavelength modulation span Δλ to be centered in the mode-hope free wavelength region.

The laser diode 210 may also experience changes in the pre-determined laser characteristics P(J) and λ(J), e.g. due to changing environmental conditions or laser aging. Such changes would make the pre-determined modulation function J(t) no longer optimal, i.e. not providing the target time-averaged spectral profile S(λ). To overcome this problem, the laser apparatus 200 includes a power sensor 240 coupled to the fiber-optic laser output 215 via a second tap 214, and a wavelength sensor, which monitor for changes in the drive current dependence of the laser power, and the laser wavelength, respectively. In the embodiment shown in FIG. 6, the wavelength sensor function is provided by the mode-hop detector 230, which is in this case functions as a wavelength meter, and may include a Fabry-Perot etalon, an optical splitter and two photodetectors, as known in the art.

In one embodiment, the power sensor 240 and the wavelength sensor 230 monitor the output optical power P and the laser wavelength λ during operation as the laser drive current is modulated, and provide information related to the time dependence of the output power P(t) and the laser wavelength λ(t) to the processor 255, for example, in a form of digitized signals proportional to P(t) and λ(t). The processor 255 then relates the digitized signals to the time dependence of the modulated drive current to determine the dependences P(J) and λ(J) of the laser power and the laser wavelength on the drive current, and computes the modified modulation signal J'(t) from the target spectral profile S(λ) stored in the memory 260, using for example the method described hereinabove with reference to FIG. 4, or by solving equation (9) using any other suitable approach. In some embodiments, this in-operation computing of the modulation function can be done at a pre-determined time fractions during the laser operation. In other embodiments, the processor 255 adjusts the modulation function J(t) in response to a change in the drive current dependence of at least one of the laser power and the laser wavelength, as detected using the signals received from the power sensor 240 and/or the wavelength sensor 230.

The power sensor 240 may provide a feedback signal to the current source 250 for maintaining a time-averaged output optical power of the laser apparatus 200 at a constant level.

In the embodiments wherein the mode-hope sensor 230 provides the real-time wavelength monitoring function, it can be used for direct estimating of the time-averaged wavelength spectral profile S(λ) by integrating the detected wavelength in time; this function can be performed by the processor 255 and/or by the wavelength sensor 230 itself. In other embodiments, the wavelength sensor 230, instead of providing a real-time wavelength monitoring at the laser modulation frequency f=½T, may be embodied as an averaging spectrometer, e.g. using a grating and a photo-receiver array as known in the art, to provide to the processor 255 spectral information for determining an estimated time-averaged spectral profile $S_e(\lambda)$, for comparing thereof with the target spectral profile S(λ) stored in the memory 260, and for adjusting the modulation function J(t) as required.

The embodiments described hereinabove in this specification are given for illustration purposes only and are not meant to limit the scope of the invention, as defined by the appended claims. For example, although the preferred mode of carrying out the invention has been described in relation to the drive-current modulation of laser diodes, the method of the present invention can also be applied to other types of current-tunable lasers or voltage-tunable lasers. Of course numerous other embodiments may be envisioned without departing from the spirit and scope of the invention.

I claim:

1. A method of coherence reduction for a laser diode having a laser wavelength λ which varies in dependence upon a drive current J of the laser diode, the method comprising:
periodically modulating the drive current J of the laser diode within a current modulation interval ($J_{min}$, $J_{max}$) between a minimum drive current $J_{min}$ and a maximum drive current $J_{max}$ using a modulation function J(t), wherein t represents time, wherein said modulation function J(t) is characterized by a greater slope at the edges of the current modulation interval ($J_{min}$, $J_{max}$) than in the middle thereof, so as to provide laser radiation with an optical spectrum having a Gaussian-like shape when averaged over at least one modulation time span that is defined as a time interval wherein the modulation function J(t) varies between $J_{min}$ and $J_{max}$,
wherein an average value of the slope of the modulation function J(t) at the edges of the current modulation interval ($J_{min}$, $J_{max}$) computed by averaging over the first 5% and last 5% of the modulation time span is more than two times greater than an average value of the slope of the modulation function J(t) in the middle of the current modulation interval ($J_{min}$, $J_{max}$) computed by averaging over a center third of the modulation time span.

2. A method as defined in claim 1, wherein an average value of the slope of the modulation function J(t) at the edges of the current modulation interval ($J_{min}$, $J_{max}$) that is computed by averaging over the first and last 2% of the modulation time span is more than 5 times greater than the average value of the slope of the modulation function J(t) in the middle of the current modulation interval ($J_{min}$, $J_{max}$).

3. A method as defined in claim 1, comprising the steps of:
selecting a target spectral profile S(λ);
determining the dependence of the laser wavelength on the drive current J; and,
computing the modulation function J(t) based on the target spectral profile S(λ) and the dependence of the laser wavelength λ on the drive current.

4. A method as defined in claim 3, wherein the step of computing the modulation function comprises the steps of:
(a) selecting a plurality of drive currents $J_j$ within the current modulation interval ($J_{min}$, $J_{max}$), and
(b) computing fractions of time when the laser diode is to be driven at each of the plurality of drive currents $J_j$ to provide laser radiation which optical spectrum has the target spectral profile S(λ) when averaged over the modulation time span.

5. A method as defined in claim 4, wherein step (b) comprises, for each drive current $J_j$, performing the steps of:
(c) determining the laser wavelength $\lambda_j$ corresponding to said drive current $J_j$ using the predetermined dependence of the laser wavelength λ on the drive current;
(d) computing a first optical power value $S_j$ from a value of the target spectral profile S(λ) at said laser wavelength $\lambda_j$; and,
(e) determining a fraction of time when the laser diode is to be driven at said drive current $J_j$ to provide an average optical power at said wavelength $\lambda_j$ that is proportional to said optical power value $S_j$.

6. A method as defined in claim 5, wherein step (B) comprises interpolation.

7. A method as defined in claim 3, wherein step (e) comprises dividing the first optical power value by a second optical power value that accounts for a dependence of the optical power of the laser diode on the drive current.

8. A method as defined in claim 3, wherein the step of determining the shape of the modulation function comprises the steps of:
(A) determining an inverse modulation function, which defines a time value as a function of a drive current value, from the target spectral profile and the dependence of the laser wavelength on the drive current; and,
(B) inverting the inverse modulation function to determine the modulation function.

9. A method as defined in claim 3, wherein the target spectral profile is a truncated Gaussian function.

10. A method of claim 3, wherein the shape of the modulation function is determined using the steps of:
for a plurality of drive current values within a drive current interval, determining a first plurality of optical power values from the target spectral profile and the pre-determined dependence of the laser wavelength on the drive current;

dividing the first plurality of optical power values by a second plurality of optical power values determined from the output power dependence on the drive current to obtain a plurality of time fraction values;

determining a plurality of time values corresponding to the plurality of drive current values from the plurality time fraction values to obtain a discrete time versus current function; and inverting the discrete time versus current function.

11. A method of claim 4, further comprising the steps of:

monitoring the dependence of at least one of the laser wavelength and the laser optical power on the drive current;

responsive to a change in the drive current dependence of one of the laser wavelength and the optical power, adjusting the modulation function so as to maintain the shape of the time-averaged optical spectrum of the laser radiation substantially as defined by the target spectral profile $S(\lambda)$.

12. A laser apparatus implementing the method of claim 1, comprising:

the laser diode having the wavelength $\lambda$ that depends on the drive current J;

a current source for supplying the drive current to the laser;

a first memory for storing the modulation function J(t); and, a modulator coupled to the current source and the memory for periodically modulating the drive current J of the laser diode using the modulation function stored in the memory.

13. A laser apparatus according to claim 12, wherein the first memory is for storing a plurality of values of the modulation function for a plurality of time values.

14. A laser apparatus according to claim 12, further comprising a second memory for storing a target spectral profile of the laser radiation.

15. A laser apparatus according to claim 14, further comprising:

sensing means for sensing at least one of: a change in the drive current dependence of the laser power, and a change in the drive current dependence of the laser wavelength; and, a processor coupled to the sensing means and the first and second memories for computing an adjusted modulation function in response to a change in the drive current dependence of one of the laser power and the laser wavelength, based on the target spectral profile stored in the second memory, and for storing the adjusted modulation function in the first memory.

16. A laser apparatus according to claim 12, comprising:

a mode-hop sensor for sensing a mode hop event; and, a temperature controller coupled to the mode-hop sensor for adjusting a laser temperature in response to a mode hop event for avoiding mode hops during the modulating of the laser drive current.

17. A laser apparatus according to claim 16, wherein the mode-hop sensor comprises a wavelength-dependent optical element disposed to receive a portion of the laser radiation, and a photodiode coupled thereto.

18. A laser apparatus according to claim 17, wherein the wavelength-dependent optical element comprises a Fabry-Perot etalon.

* * * * *